(12) United States Patent
Sitti et al.

(10) Patent No.: US 9,731,422 B2
(45) Date of Patent: Aug. 15, 2017

(54) METHODS, APPARATUSES, AND SYSTEMS FOR MICROMANIPULATION WITH ADHESIVE FIBRILLAR STRUCTURES

(71) Applicant: CARNEGIE MELLON UNIVERSITY, a Pennsylvania Non-Profit Corporation, Pittsburgh, PA (US)

(72) Inventors: Metin Sitti, Pittsburgh, PA (US); Yiğit Mengüç, Somerville, MA (US)

(73) Assignee: Carnegie Mellon University, a Pennsylvania Non-Profit Corporation, Pittsburgh, PA (US)

( * ) Notice: Subject to any disclaimer, the term of this patent is extended or adjusted under 35 U.S.C. 154(b) by 0 days.

(21) Appl. No.: 14/368,079

(22) PCT Filed: Dec. 21, 2012

(86) PCT No.: PCT/US2012/071168
§ 371 (c)(1),
(2) Date: Jun. 23, 2014

(87) PCT Pub. No.: WO2013/096730
PCT Pub. Date: Jun. 27, 2013

(65) Prior Publication Data
US 2014/0369802 A1    Dec. 18, 2014

Related U.S. Application Data

(60) Provisional application No. 61/630,954, filed on Dec. 22, 2011.

(51) Int. Cl.
*B25J 7/00* (2006.01)
*B25J 15/00* (2006.01)
(Continued)

(52) U.S. Cl.
CPC .............. *B25J 15/008* (2013.01); *B25J 7/00* (2013.01); *B29C 39/026* (2013.01); *B29C 39/26* (2013.01);
(Continued)

(58) Field of Classification Search
CPC   B25J 15/008; B25J 7/00; B82Y 10/00; B82Y 15/00; B82Y 99/00; B82Y 40/00;
(Continued)

(56) References Cited

U.S. PATENT DOCUMENTS

| | | | |
|---|---|---|---|
| 7,335,271 B2 * | 2/2008 | Autumn | ............. B32B 3/266 156/160 |
| 7,785,422 B2 * | 8/2010 | Autumn | ............. B08B 7/0028 134/32 |

(Continued)

FOREIGN PATENT DOCUMENTS

| | | |
|---|---|---|
| WO | 2005026042 A1 | 3/2005 |
| WO | 2008076390 A2 | 6/2008 |

OTHER PUBLICATIONS

International Search Report and Written Opinion of the International Searching Authority for PCT Application PCT/US2012/071168 dated Apr. 29, 2013.
(Continued)

*Primary Examiner* — Dean Kramer
(74) *Attorney, Agent, or Firm* — Michael G. Monyok; David G. Oberdick

(57) ABSTRACT

The present invention are methods for fabrication of micro- and/or nano-scale adhesive fibers and their use for movement and manipulation of objects. Further disclosed is a method of manipulating a part by providing a manipulation device with a plurality of fibers, where each fiber has a tip with a flat surface that is parallel to a backing layer,
(Continued)

28 contacting the flat surfaces on an object, moving the object to a new location, then disengaging the tips from the object.

23 Claims, 13 Drawing Sheets

(51) Int. Cl.
*G03F 7/00* (2006.01)
*B82Y 10/00* (2011.01)
*B82Y 40/00* (2011.01)
*B29C 39/02* (2006.01)
*B29C 39/26* (2006.01)
*B29C 39/36* (2006.01)
*B29K 101/10* (2006.01)
*B29L 31/00* (2006.01)

(52) U.S. Cl.
CPC .............. *B29C 39/36* (2013.01); *B82Y 10/00* (2013.01); *B82Y 40/00* (2013.01); *G03F 7/0002* (2013.01); *B29K 2101/10* (2013.01); *B29L 2031/756* (2013.01); *B29L 2031/7562* (2013.01); *Y10T 428/2913* (2015.01)

(58) Field of Classification Search
CPC ........... Y10S 294/902; Y10T 428/2913; B29L 2031/756; B29L 2031/7562

USPC ......................... 294/86.4, 99.1, 902; 414/800
See application file for complete search history.

(56) References Cited

U.S. PATENT DOCUMENTS

| 2006/0005362 A1* | 1/2006 | Arzt ........................ B25J 15/00 |
| | | 24/442 |
| 2006/0131265 A1 | 6/2006 | Samper et al. |
| 2008/0025822 A1* | 1/2008 | Kim .................. H01L 21/68707 |
| | | 414/217.1 |
| 2010/0136281 A1* | 6/2010 | Sitti ................... A44B 18/0049 |
| | | 428/92 |

OTHER PUBLICATIONS

Sitti, M., "High aspect ration polymer micro/nano-structure manufacturing using nanoembossing, nanomolding and directed self-assembly," ASME 2003 International Mechanical Engineering Congress and Exposition, pp. 293-297, American Society of Mechanical Engineers, 2003.

Peterman, Mark C. et al., "Building thick photoresist structures from the bottom up," Journal of Micromechanics and Microengineering 13, No. 3 (2003): 380.

* cited by examiner

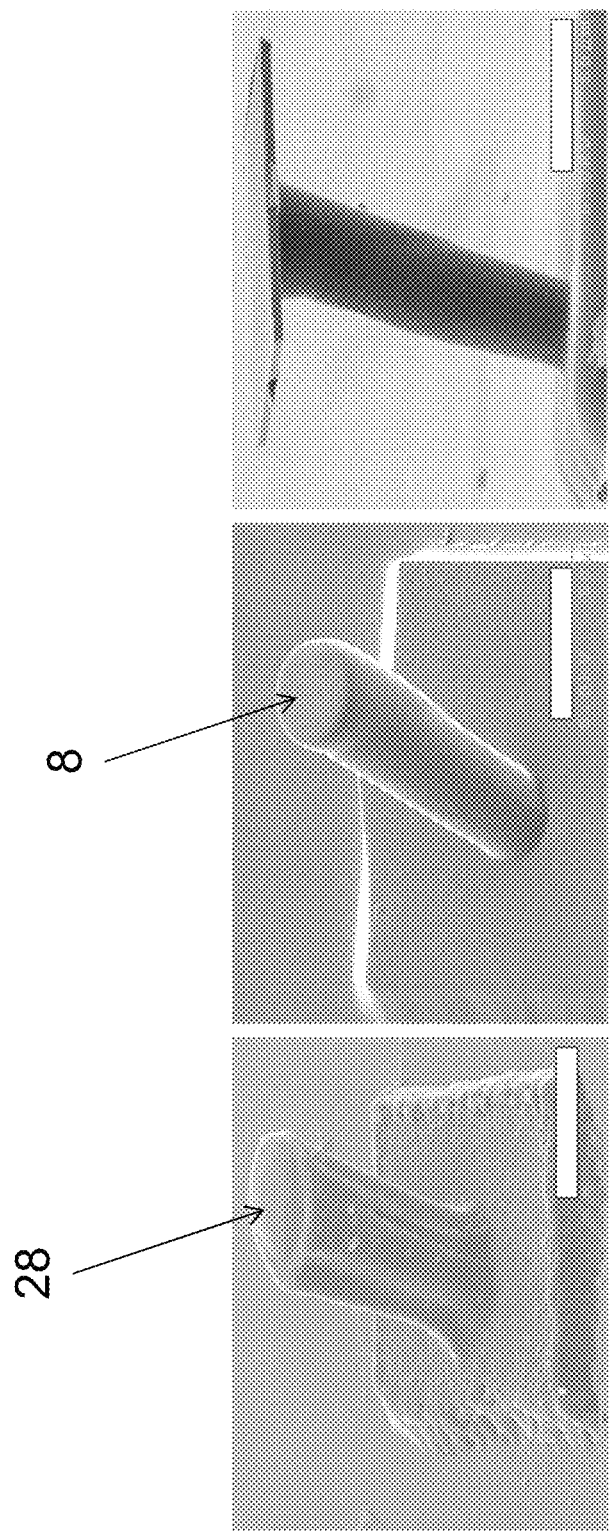

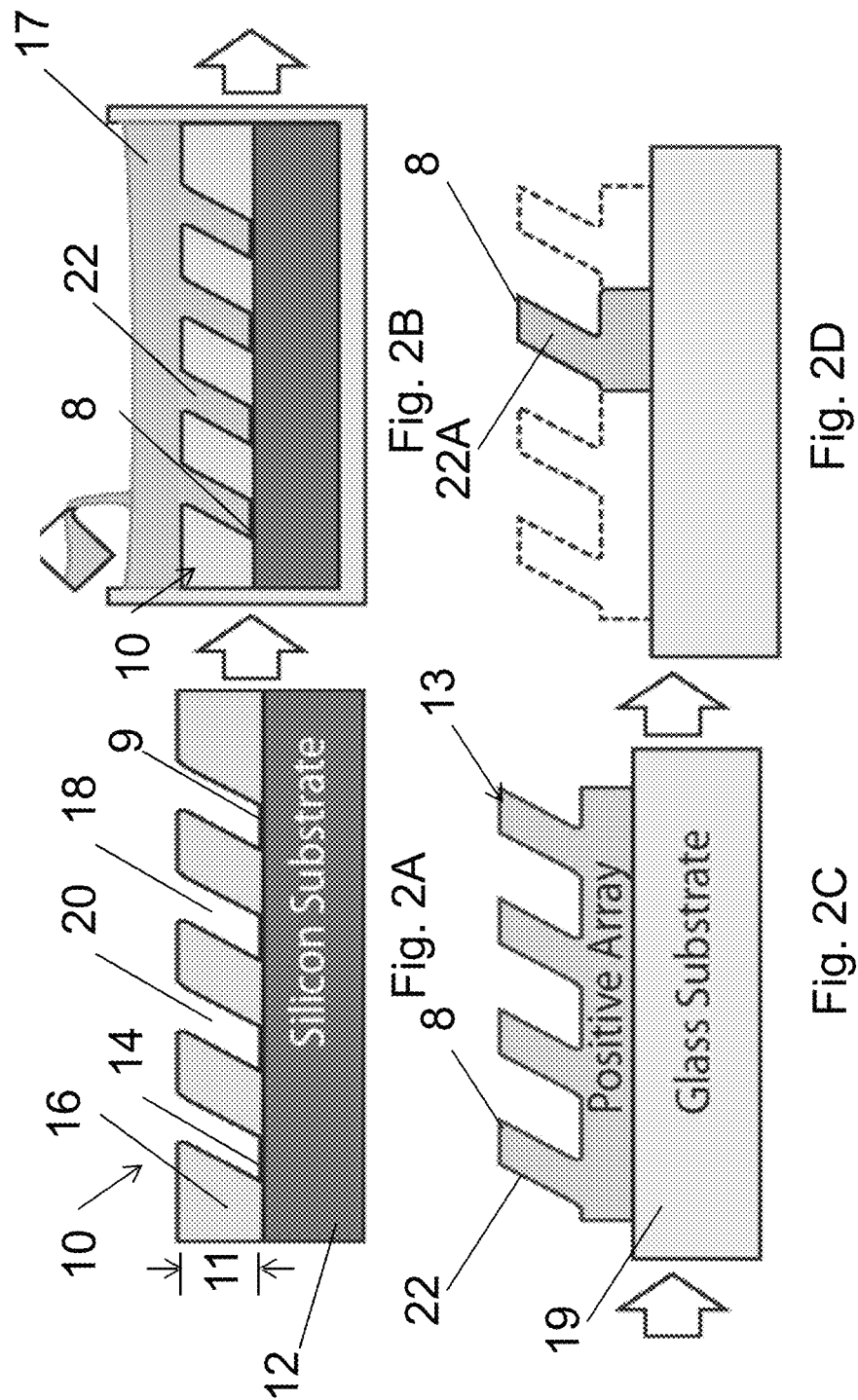

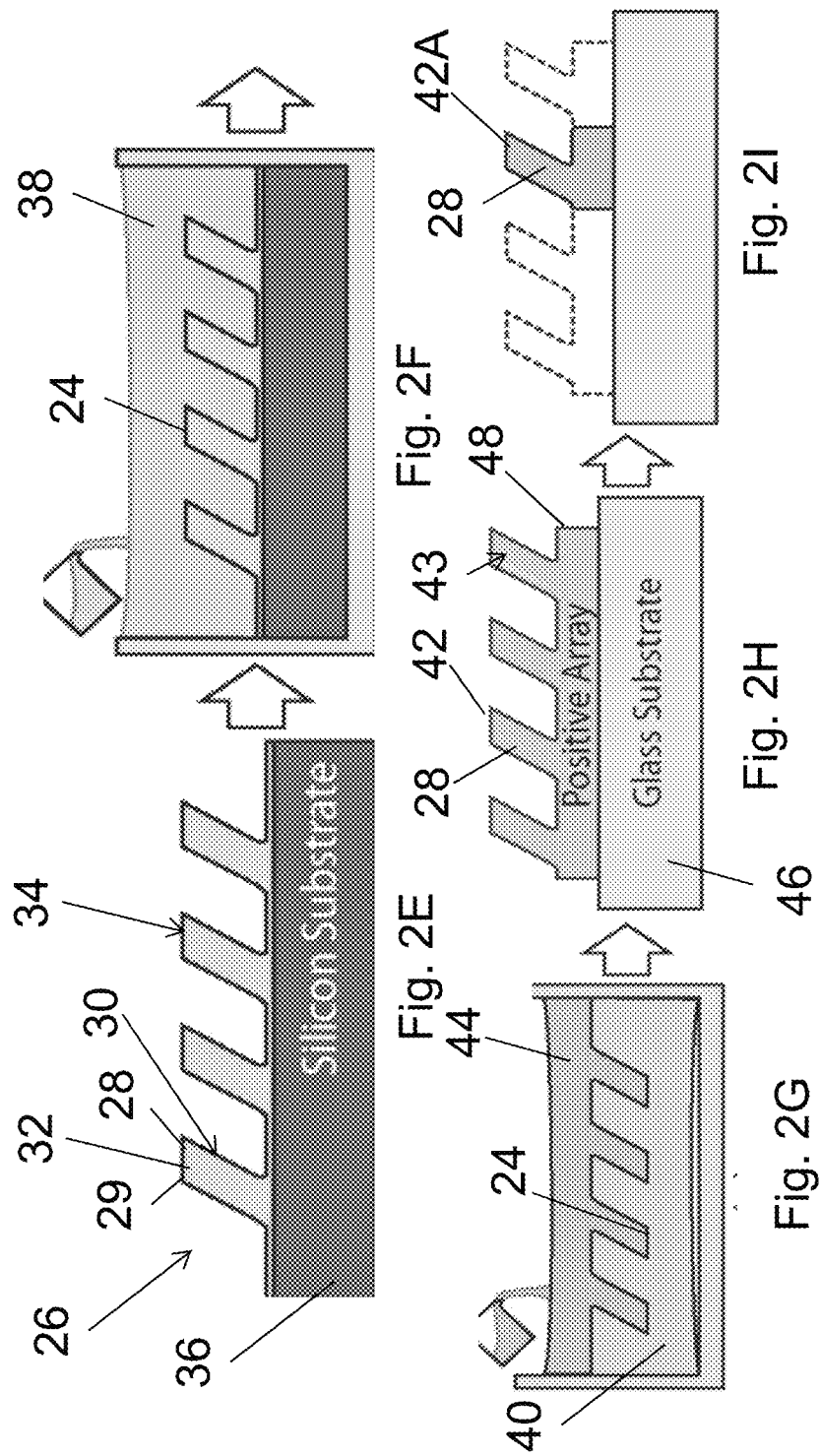

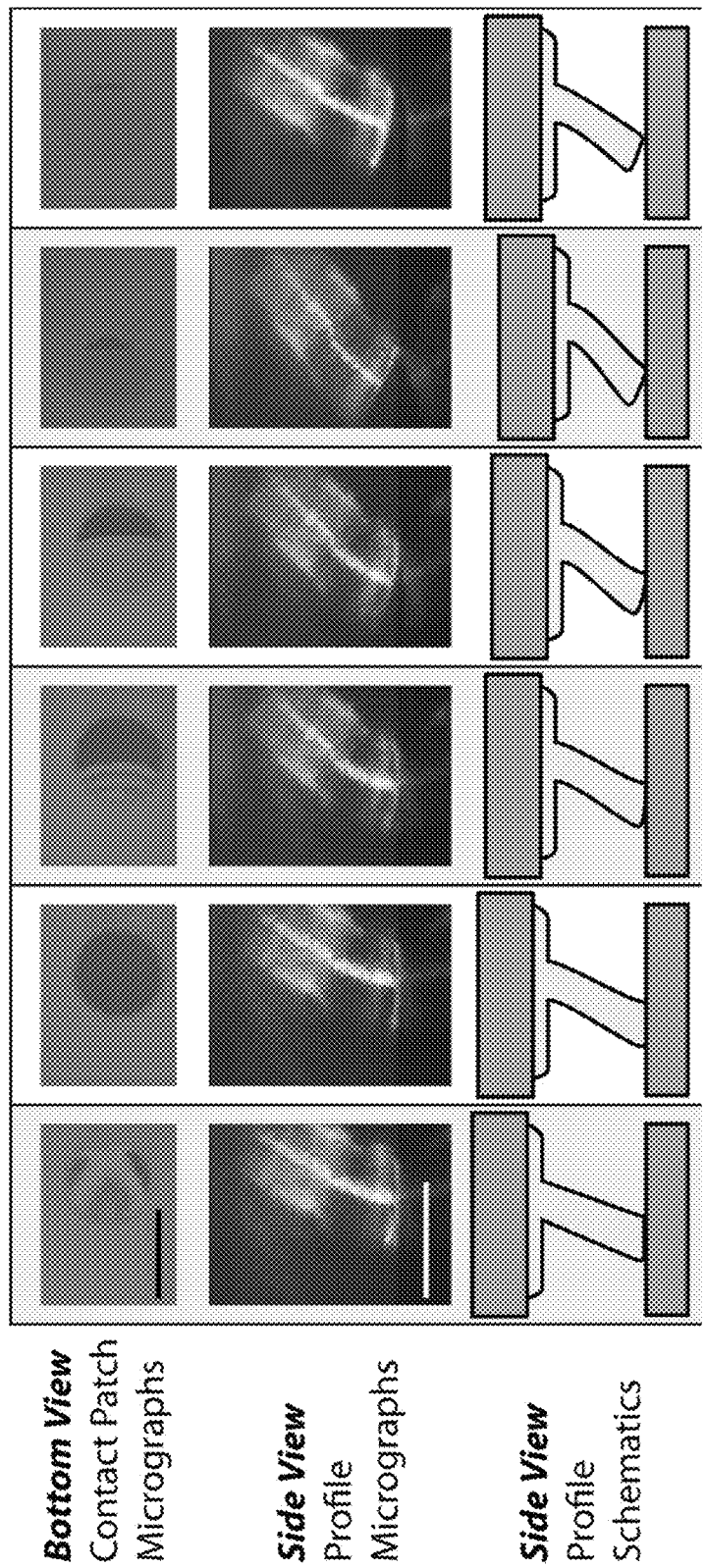

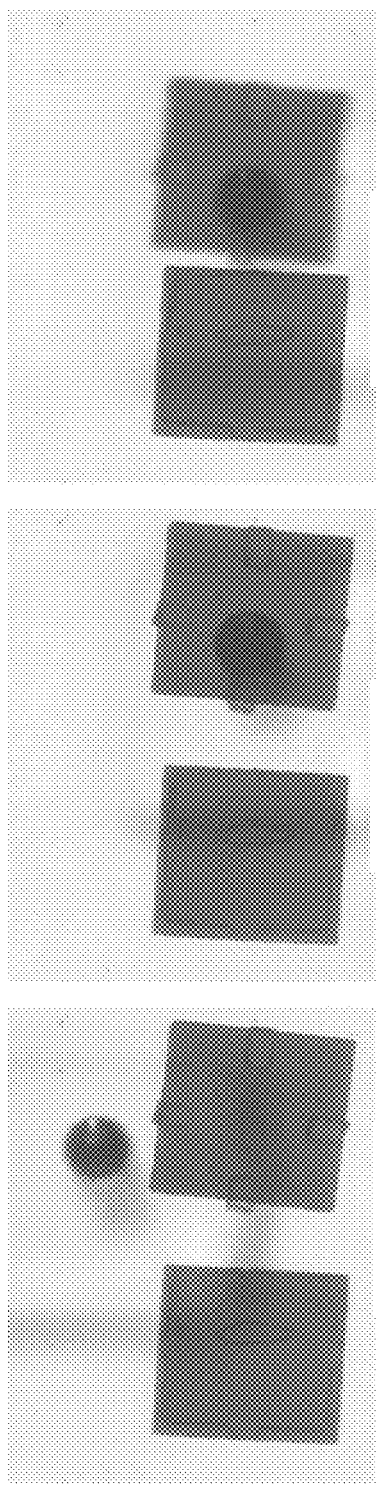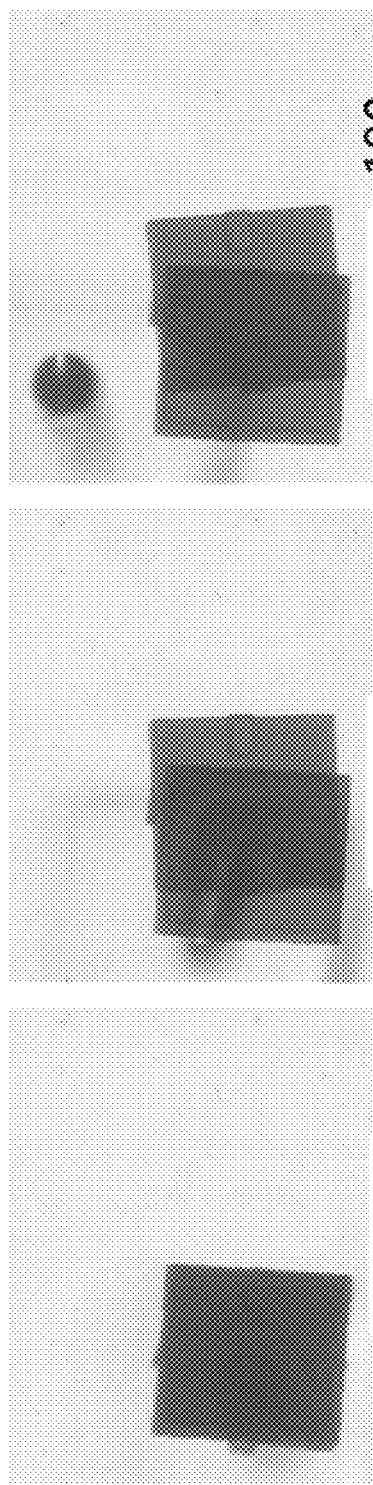

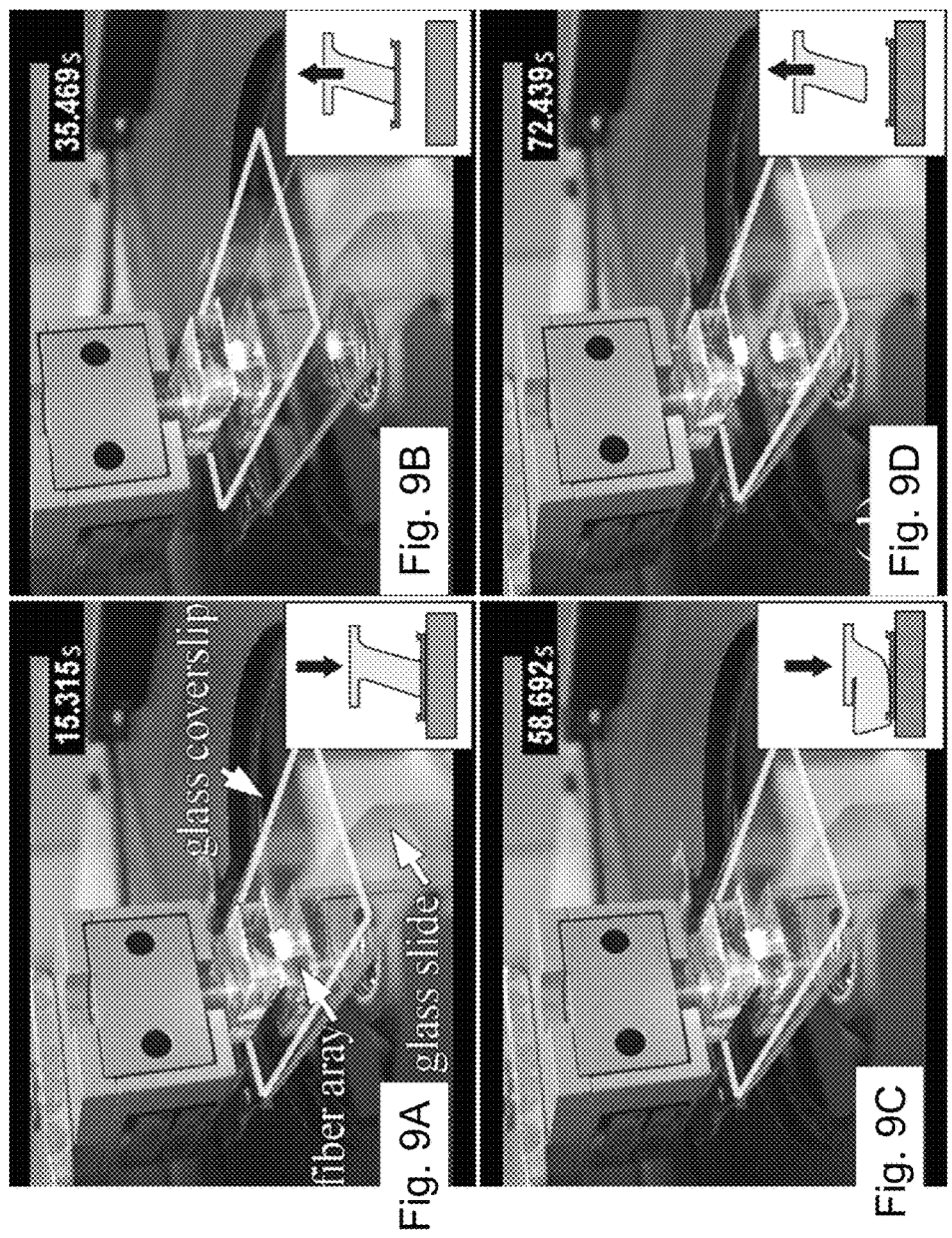

METHODS, APPARATUSES, AND SYSTEMS FOR MICROMANIPULATION WITH ADHESIVE FIBRILLAR STRUCTURES

CROSS-REFERENCE TO RELATED APPLICATIONS

This application is a U.S. national phase application of Patent Cooperation Treaty international application PCT/US2012/071168, titled METHODS, APPARATUSES, AND SYSTEMS FOR MICROMANIPULATION WITH ADHESIVE FIBRILLAR STRUCTURES, filed Dec. 21, 2012, which claims priority of U.S. Provisional Application 61/630,954, titled METHODS, APPARATUSES, AND SYSTEMS FOR MICROMANIPULATION WITH ADHESIVE FIBRILLAR STRUCTURES, filed Dec. 22, 2011, both are incorporated by reference herein.

STATEMENT REGARDING FEDERALLY-SPONSORED RESEARCH AND DEVELOPMENT

This invention was made with partial government support under National Science Foundation grant CMMI-0800408. The government has certain rights in this invention.

FIELD OF THE INVENTION

This invention relates to devices and systems for movement and manipulation of macro- and micro-scale objects. In particular, the present invention relates the fabrication and use of micro- and/or nano-scale fibers as adhesive structures that can controllably adhere to, move, and release from macro- and micro-scale objects.

BACKGROUND OF THE INVENTION

Geckos are one of nature's most agile and power-efficient climbers due to their strong, highly repeatable, high speed, and controllable attachment and detachment capabilities on a wide range of smooth and slightly rough surfaces. Such capabilities are a result of angled and hierarchical micro and/or nanoscale fibrillar structures on their feet, which have saucer shaped tip endings. These micro/nanostructures can exhibit repeatable adhesive strengths up to 200 kPa on smooth and rigid surfaces such as glass. The attachment strength of gecko foot-hairs has been shown to be rooted in intermolecular forces such as van der Waals forces, which exist between all surfaces and is fairly insensitive to surface chemistry. This generic attachment principle enables the animal to climb on a wide range of surface materials. The importance of geometry, size, material type, and surface physics of these biological foot-hairs to their adhesion strength, rather than their surface chemistry, leads these biological adhesives to be called structured adhesives. Many researchers have proposed methods to design and fabricate such synthetic micro/nanostructured adhesives inspired by gecko foot-hairs.

In addition to high attachment strength, biological micro/nanofibrillar structures exhibit highly controllable adhesion. The controlled adhesion and shear strength of gecko's angled fibrillar structures is dependent on mechanical deformations induced by vertical and lateral loading of its feet, which can actively control the contact area between the structures and the substrate. It has been demonstrated that gecko foot-hairs have a friction ratio of around 5 to 1 comparing the with to against hair tilt directions.

Synthetic structured adhesives have been designed in an attempt to mimic the strength and controllability of these biological foot-hairs. It has been shown that when stiff polymer microfiber arrays are angled they exhibit anisotropic behavior of shear strength with a ratio of 45 to 1 between dragging resistance in with and against fiber tilt directions. However, in both of these vertical and angled cases, the microfibers had low adhesive strength. Researchers have used multi-wall carbon nanotubes (MWCNT) to create a structured surface with even smaller features that exhibit adhesive strength of 100 kPa and shear strength of 80 kPa. Similarly, embedding MWCNT arrays in polymer backing showed enhanced friction, but these MWCNT surfaces lacked controllable adhesion.

In the study with results closest to the strength and controllability of biological foot-hairs, researchers have developed elastomer, angled polymer fibers with angled mushroom shaped tip endings which demonstrated interfacial shear pressures of 100 kPa and adhesion pressure of 50 kPa. These structures exhibited controlled shear and adhesion strength: with-to-against friction ratios of around 5 to 1 and adhesion ratios of 35 to 1. Subsequently, surface treatments have been used to enhance adhesion of polymer microfibers in air and under water. In a different approach to adhesion control, thermal control has been used on shape memory polymer fiber arrays.

The aforementioned preload- and shear-controlled adhesion and friction properties could be one of the major reasons why biological gecko foot-hairs can shed dirt particles in dry conditions. Researchers have demonstrated that dirt microparticles much larger than the fiber tip diameter could be shed from the gecko's foot after it is attached to and detached from a clean glass substrate in many cycles, a process termed contact self-cleaning. Such contact self-cleaning property has been also been shown in synthetic polymer fiber adhesives by shear loading. These studies suggest that micro/nanostructures could also be used for pick-and-place manipulation of micro or macroscale parts since they enable controlled attachment (pick) and detachment (release). Therefore, microstructured adhesives inspired by these biological structures have recently been used for manipulation at the micro and macroscale.

Researchers have presented elastomer micropyramidal structures as adhesion controlled micromanipulators. These microstructures used vertical compression induced contact area control such that there was a relatively large contact area when sufficiently large compressive loads buckled the microstructures. If pulled away quickly, the planar part was picked up with a high pull-off force because rate-dependent effects enhanced the adhesion strength further. After the part was picked, the buckled elastic structures reverted to their original shapes. This shape recovery significantly reduced the contact area, and thus, adhesion, between the pyramid structures and the part and enabled easy part release. The maximum ratio of pick to release adhesive forces was 1000 to 1. But, this manipulator had small holding forces after lifting the part from the donor substrate. Though the holding force was not measured directly, the observed contact area while holding a part was three orders of magnitude less than while picking up a part, indicating a holding force less than 1 nanonewtons, which could be a problem for heavy parts or for mechanical disturbances during transfer of the parts. Researchers have addressed this limitation by removing the micropyramidal structures of the manipulator and used shear displacement control to reduce attachment strength, at the cost of a reduced pick to release force ratio, but the force ratio was not presented. Researchers has utilized angled nanofibers with high shear strength to transfer thin film transistor (TFT) displays under vacuum or air as a macroscale manipulation demonstration. However, micron scale part manipulation was not demonstrated and the nanofiber array required a constant application of shear force for strong adhesion.

SUMMARY OF THE INVENTION

The present invention is a gecko foot-hair inspired angled pillar microstructure with flat or round tip ending shape (FIGS. 1A-C) to improve the versatility and simplicity of the elastomer micro and/or nanostructure-based pick-and-place manipulation of macro and microscale parts. Scanning electron micrographs taken from an isometric viewpoint of FIG. 1A is the round tip micropillar, FIG. 1B is the flat tip micropillar, and FIG. 1C is a side view of the flat tip pillar attached to a silicon platelet part. The micropillars are made of elastomeric polyurethane. The white scale bars represent 50 μm of length. The present invention is described in two simple control methods for reducing attachment strength of the pillar during the part release: vertical displacement control and shear displacement control. Picking of the part is accomplished in the same way for both control methods, by vertical compression of the tip to the part and rapid retraction to maximize adhesion strength. Tip adhesion with the part can be due to any attractive forces such as van der Waals, hydrogen bonding, capillary, magnetic, vacuum suction, mechanical interlocking, or electrostatic forces. During transfer of the part, the attachment between the pillar and the part is secure enough to withstand sudden impacts and disturbances as well as the weight of the part, issues that could be a limiting factor with some of the prior art. During release of the part onto a receiver substrate, the contact area of the pillar to the part is drastically reduced by the deformation of the pillar due to either the vertical or shear displacement control method. In contrast to the prior art nanofiber arrays, the parts can be picked and released in both adhesion and shear modes in the approach described here.

Such compliant micromanipulators are simple and inexpensive to manufacture, easy to integrate into optical microscopy infrastructure, and can operate in air, in vacuum and under liquid. Finally, such compliant polymer micropillars are safe for use with fragile parts, and, due to exploiting intermolecular forces, are effective on most materials. This micromanipulation system's ease and effectiveness will be a benefit to the assembly and packaging of microelectromechanical systems and optoelectronic and flexible electronic devices.

BRIEF DESCRIPTION OF THE DRAWINGS

FIGS. 1A-C show scanning electron micrographs of adhesive fibers fabricated and used according to the present invention;

FIGS. 2A-D show schematic representations of the processes for fabrication of the adhesive fibers according to the present invention for flat tips;

FIGS. 2E-I show schematic representations of the processes for fabrication of the adhesive fibers according to the present invention for rounded tips;

FIGS. 3A-F show video stills and schematic drawings of the contact between an adhesive fiber fabricated according to the present invention, and an object to be manipulated in accordance with the present invention;

FIGS. 8A-F show video snapshots of the steps of a pick-and-place manipulation of an object according to the present invention;

FIGS. 9A-D show images of the use of an array of adhesive fibers to manipulate and object;

DETAILED DESCRIPTION OF THE INVENTION

This invention describes method for fabrication of micro- and/or nano-scale adhesive fibers and their use for movement and manipulation of objects.

Fabrication

Previous work has shown the importance of the tip geometry on the adhesion and friction of microfiber adhesives. In the present invention, two distinct pillar types are described that are similar in all geometric and material parameters except for the shape of the tip. The first type has a flat tip, the surface of which is parallel to the plane of the backing layer. The second type's tip is in the shape of a rounded bump with a given curvature. The principle of the fabrication methodology of the present invention is based on an optical lithography based microstructure fabrication followed by a molding based replication. Angled elastomer micropillars can be fabricated by replicating positive pillars fabricated by directional reactive ion etching or SU-8 lithography. The latter method is described in detail due to its simplicity.

Figure 10:
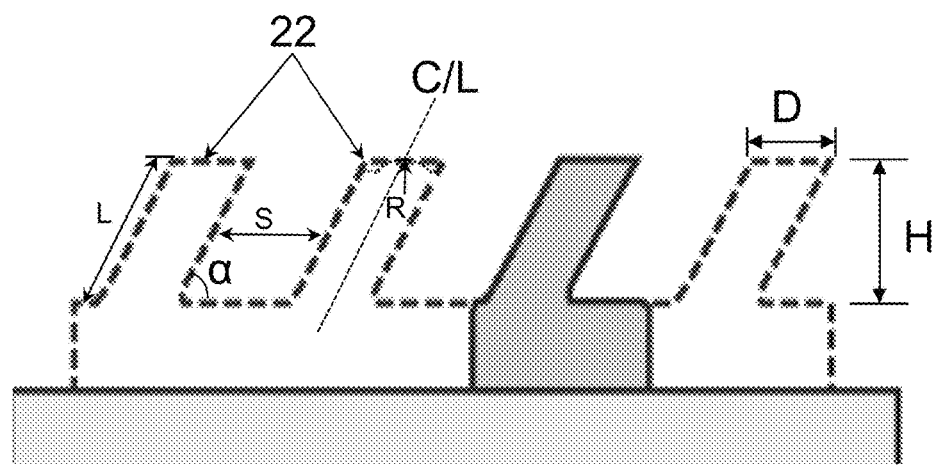
FIG. 10 and FIG. 12 illustrating the radius of the round tip fiber.

Flat tips 8 can be formed from negative molds 10 made from materials such as SU-8 because the polymer tips 8 (FIG. 2B) cure against the atomically smooth outer surface 9 of a silicon substrate 12 (FIG. 2A). The angled flat tip micro- and/or nanoscale pillar 22 fabrication process starts with the patterning of, for example, an SU-8 mold 10. A silicon substrate 12 is spin coated with, for example, a 160 nm thick anti-reflection layer 14 (for example, XHRiC-16, Brewer Science). On top of the anti-reflection layer 14, SU-8 negative photoresist material layer 16 (for example, SU-8 50, Microchem) is spin coated and soft-baked, in one embodiment into a 90 μm thick layer 11. The photoresist material layer 16 can have a thickness 11 ranging from about 10 nm to about 10 mm. To fabricate the angled pattern 18, the silicon substrate 12 with soft-baked SU-8 photoresist material layer 16 is mounted on an angled stage (not shown) and exposed to ultraviolet (UV) light, followed by a post-exposure baking and development. The resulting SU-8 mold 10 has a negative pattern, i.e. composed of angled holes 20 (FIG. 2A), which are hard baked, in one embodiment at 180° C. for 3 min to induce further crosslinking. An outer surface 9 of the silicon substrate 12 is exposed between adjacent angled holes 20 of the plurality of angled holes. The SU-8 angled micro- and/or nanoscale pillars 22 are then molded with a liquid polymer 17 (FIG. 2B), which creates arrays 13 of elastomer micro- and/or nanoscale pillars 22 (FIG. 2C). To facilitate the delamination of the micro- and/or nanoscale pillars 22 (for example, polydimethylsiloxane (PDMS)) from the SU-8 mold 10 (FIG. 2C), the mold 10 can be exposed to the vapor of a desiccator, such as tridecafluoro-1,1,2,2-tetrahydrooctyl-1trichlorosilane for 60 min. Array 13 is isolated in FIG. 2D to illustrate a single micro- and/or nanoscale pillar 22A. Liquid polymer 17 can be a thermoset elastomer such as silicone, rubber, polydimethylsiloxane, acrylate, and polyurethane, or any suitable thermoplastic elastomer. FIG. 10 illustrates space S between adjacent pillars or fibers 22 and length L of each pillar or fiber 22. Spacing S can range from about 1 nm to about 500 mm. Length L can range from about 1 nm to about 100 mm Rounded tips 24 are formed from positive SU-8 photoresist molds 26 because the tips 28 of the standing SU-8 photoresist posts 30 are etched more along the perimeter 29 creating a curving of the top surface 32 of tips 28 to form a radius R (FIG. 10) when etching SU 80 photoresist posts 30 to form an angled round tip micro- and/or nanoscale pillar 34, where radius R is in proximity of the center line C/L of pillar or fiber 22. Radius R can range from zero to infinity. By tuning the exposure and development times by a trial and error process, the curvature of the tip 28 can be controlled. The angled round tip micro- and/or nanoscale pillar 34 described herein is fabricated using the lithography (for example, using SU-8) and molding techniques described in previous works. In a similar approach to the flat tip pillar fabrication, in one embodiment illustrated in FIG. 2E, SU-8 photoresist (SU-8 2050, Microchem Corp.) is spun on a fused silica substrate 36 and exposed through a mask (not shown) by angled UV light (MA-56, Karl Suss). The difference in round-tip fabrication from flat-tip fabrication is in the mold: the round-tip mold is a positive pattern, i.e. composed of angled micro- and/or nanoscale pillars 34 (FIG. 2E). The SU-8 angled micro- and/or nanoscale pillars 34 are then molded with a silicone rubber 38 (FIG. 2F) (for example, HS II RTV, Dow Corning), which serves as the negative pattern mold 40 (FIG. 2G) for creating arrays 43 of elastomer micro- and/or nanoscale pillars 42 (FIG. 2H). One embodiment of the curvature of the round tip structure 28 can be characterized with interferometric profilometry and the radius of curvature can be 380 μm. The round tip radius R can range from about 1 nm to about 100 mm. The curvature of the tip 28 is a controllable design parameter, which can range from 10 ths of microns radius of curvature up to infinite radius of curvature (i.e. flat tip). Array 43 is isolated in FIG. 2I illustrating a single micro- and/or nanoscale pillar 42A.

Photolithography of SU-8 using a UV light source is a relatively accessible and established process, but it is not the only approach for producing angled polymer micro and/or nanostructures 13, 43. Researchers have adapted the process of deep reactive ion etching (DRIE) to the angled etching of polysilicon. This allows for a higher degree of control and repeatability in the structures' geometry, but requires a less common fabrication technology. Conversely, issues of consistency in SU-8 fabrication can be addressed by identifying and isolating single structures with desired geometries.

The material used as the final micro- and/or nanoscale pillar arrays 43 can be a variety of polymers 44 (FIG. 2G). In one embodiment, the arrays 43 are formed with ST-1087 (BJB Enterprises, Inc.), a polyurethane elastomer with a Young's modulus of 9.8 MPa and an effective work of adhesion on glass of 32 mJ m$^{-2}$. Young's modulus can range from about 0.01 MPa to about 100,000 MPa. Effective work of adhesion can range from about 10 mJ m$^{-2}$ to about 2,000 mJ m$^{-2}$. This particular polyurethane has high tensile strength and high surface energy while remaining optically transparent.

The geometry of the arrays 43 can be characterized with optical microscopy (TE200 Eclipse, Nikon), interforemetric profilometry (NewView™ 7300, Zygo), and scanning electron microscopy, (SEM, Hitachi 2460N). All arrays 43 were molded onto substrate 46, for example ~2 mm on a side, to provide a rigid, transparent backing and to ease manual handling (FIG. 2H). The molding process resulted in the substrate 46 being covered in several hundred micro- and/or nanoscale pillars 42, with a polyurethane backing layer 48, for example, less than 20 μm thick between micro- and/or nanoscale pillars 42 and the rigid substrate 46. This thin backing layer 48 is advantageous because it reduces any complicating effects of the soft backing. Polyurethane backing layer 48 can have a thickness ranging from about 1 nm to about 100 mm. Substrate 46 can be made of glass, acrylic or other suitable material.

In summary, FIGS. 2A-I are schematic representations of the two fabrication processes. For flat tips 8, FIG. 2A starts with an SU-8 photoresist negative mold 10 on a silicon substrate 12; FIG. 2B illustrates pouring the liquid polymer 17 into the SU-8 photoresist negative mold 10 and curing the liquid polymer 17 directly in the SU-8 photoresist negative mold 10; FIG. 2C illustrates the positive micro- and/or nanoscale pillar array 13 of micro- and/or nanoscale pillar 22 that is the product of the above mentioned molding process on a glass substrate 19; and, FIG. 2D illustrates the final selection and isolation of a single micro- and/or nanoscale pillars 22A. For rounded tips 28, FIG. 2E starts with an array of positive SU-8 micro- and/or nanoscale pillars are etched more along the perimeter 29 creating a curving of the top surface 32; FIG. 2F illustrates pouring a liquid Silicone Rubber 38 into the SU-8 photoresist positive mold 26 and curing a negative Silicone rubber mold 40; FIG. 2G illustrates a liquid polymer 44 being poured into the negative Silicone rubber mold 40 where it is cured; FIG. 2H illustrates the positive array 43 that is the product of the above mentioned molding process on a glass substrate 46; and FIG. 2I illustrates the final selection and isolation of a single micro- and/or nanoscale pillar 42A. Fabricating structures from a negative photoresist mold 10 (FIGS. 2A-D) results in angled micro- and/or nanoscale pillars 22A with flat tips 8 (see FIG. 1B). Replicating positive photoresist molds 26 (FIGS. 2E-I) results in angled micro- and/or nanoscale pillars 42A with round tips 28 (see FIG. 1A).

Below is a table of the fiber parameters used for the experiments described above:

| Fiber Type | Round | Flat |
| --- | --- | --- |
| Length (L) | 75 μm | 95 μm |
| Height (H) | 72 μm | 89 μm |
| Angle of inclination (a) | 16° | 20° |
| Diameter (D) | Elliptical (35 μm, 45 μm) | 35 μm |
| Radius of Curvature of tip (R) | 380 μm | N/A |
| Young's Modulus | 9.8 MPa | 9.8 MPa |
| Work of adhesion | 32 mJ m$^{-2}$ | 32 mJ m$^{-2}$ |

Object Manipulation
Experimental Setup

In order to characterize the performance of the microstructures in object manipulation tasks, a custom experimental system was employed. This system is based upon automated flat-punch indentation setups previously used in adhesion characterization experiments. Using an inverted optical microscope (TE200 Eclipse, Nikon) as the base for the fixturing as well as the source of visual feedback, a vertical axis of motion and sensing was mounted such that the point of intersection between the pillar micromanipulator and substrate would occur at the focal range of the optics. The vertical axis motion was provided by a linear motorized stage (MFA-CC, Newport) with submicron positional accuracy and a speed range from 1 $\mu m\ s^{-1}$ to 2500 $\mu m\ s^{-1}$. The vertical stage was mounted to a two axis manual linear stage (462 Series, Newport) and a two axis goniometer (GON40-U, Newport) to align the adhesive sample with the optics and the substrate.

Sensing was achieved through a high resolution load cell (GSO-10 and GSO-30, Transducer Techniques), which was used with a signal conditioner (TMO-2, Transducer Techniques). The video was captured through a color digital camera (DFW-X710, Sony) connected to a desktop computer (Aspire ASE380-ED500U, Acer) operating Linux (Ubuntu 7.10 Gutsy Gibbon). The force data was captured as an analog voltage signal through a data acquisition board (NI PCI-6259, National Instruments) mounted in the computer, and all motion control was achieved through commands sent from the computer to a motor controller (ESP300, Newport) to which the motorized stage was connected. All data capture and motion control was managed by custom software running on the computer.

The experimental control parameters included the speed of approach of the adhesive sample to the substrate, the initial amount of compressive load applied (preload), the amount of displacement in the compressive direction after preloading, the amount of displacement in the lateral shear direction after preloading and finally the pull-off speed. The variable which was measured was the applied normal force on the micropillar during loading and retraction. Visual feedback from the video recording gave qualitative information regarding the mechanics of the structures. Contact area visualization and fiber tip geometry was enhanced by interference patterns in 546 nm wavelength monochromatic green light with the corresponding optical filter during the pick and release of parts.

It is important to note that the control variable in all experiments was displacement, either vertical or shear. Force based control failed to capture intermediate load states because of the unstable nonlinear response of the pillars under compression. from about 1 nm up to about 100 mm of compressive displacement Vertical Displacement Experiments A typical adhesion characterization experiment would have the structural adhesive sample mounted on the vertical axis such that the adhesive was pointing downward towards the substrate mounted to the microscope fixture. After approaching at 1 $\mu m\ s^{-1}$ (constant for all tests) and achieving a desired preload of 0.05 mN (constant for all tests) the vertical stage would continue to compress the pillar for a prescribed displacement. Once the prescribed compressive displacement was achieved, the vertical linear stage retracted the micropillar at a constant velocity. The maximum tensile force during pull-off was recorded as the adhesive force.

Shear Displacement Experiments

In the case of applying shear displacement during the part release, the manual linear stage was employed after the compression step was completed, but before retraction. After achieving the prescribed compressive displacement the motorized linear stage paused for 10 seconds to allow the experimenter to displace the pillar laterally through the use of the manual linear stage. As before, the maximum tensile force was recorded as the adhesive force.

Demonstration of Pick-and-Place Manipulation

A micromanipulator composed of a single angled pillar was used for all empirical characterization as well as demonstrations of pick-and-place of 100×100×3 $\mu m^3$ silicon platelets. The silicon parts were fabricated according to well-known techniques. The manipulation of the centimeter-scale glass slide was conducted with an array of 100 round tip pillars arranged in a square packed pattern with 120 $\mu m$ center to center distance.

Results

Effect of Tip Shape

The two micropillar geometries of the present invention were investigated, one with a flat tip and one with a rounded tip. The flat tip pillar's contact process is captured in micrographs and sketches in FIGS. 3A-F, where the contact area micrographs show that the "toe" (defined as the edge of the tip further away from the base of the pillar) peels up after a critical amount of compressive displacement (FIGS. 3C-F). A rounded tip pillar's contact process resembles the flat tip process, except for the lack of a critical peeling event, rather, the tip slides along the surface until the entire pillar is bent over and prone. Each column shows three corresponding images: (top row) video stills of the flat tip pillar's contact to a smooth, flat glass as seen through an inverted microscope with monochromatic green lighting; (middle row) side view video stills of the profile of the flat tip pillar as it is vertically compressed; (bottom row) side view schematics of the pillar profile during vertical compression and retraction included in order to aid in visualizing the process. The process begins when the tip barely makes contact (FIG. 3A) before fully contacting the surface; FIG. 3B illustrates additional compression causes peeling due to mechanical instability; FIG. 3C is an illustration after which the tip continues to slide along and peel away from the surface; FIGS. 3D and 3E illustrate, upon retracting, the contact patch is seen to be minimized; FIG. 3F illustrates the scale bars for each row is included in FIG. 3A, and all represent the same length: the diameter of the flat tip, 35 $\mu m$. The flat tip diameter can range from 1 nm to 100 mm.

Figure 4:
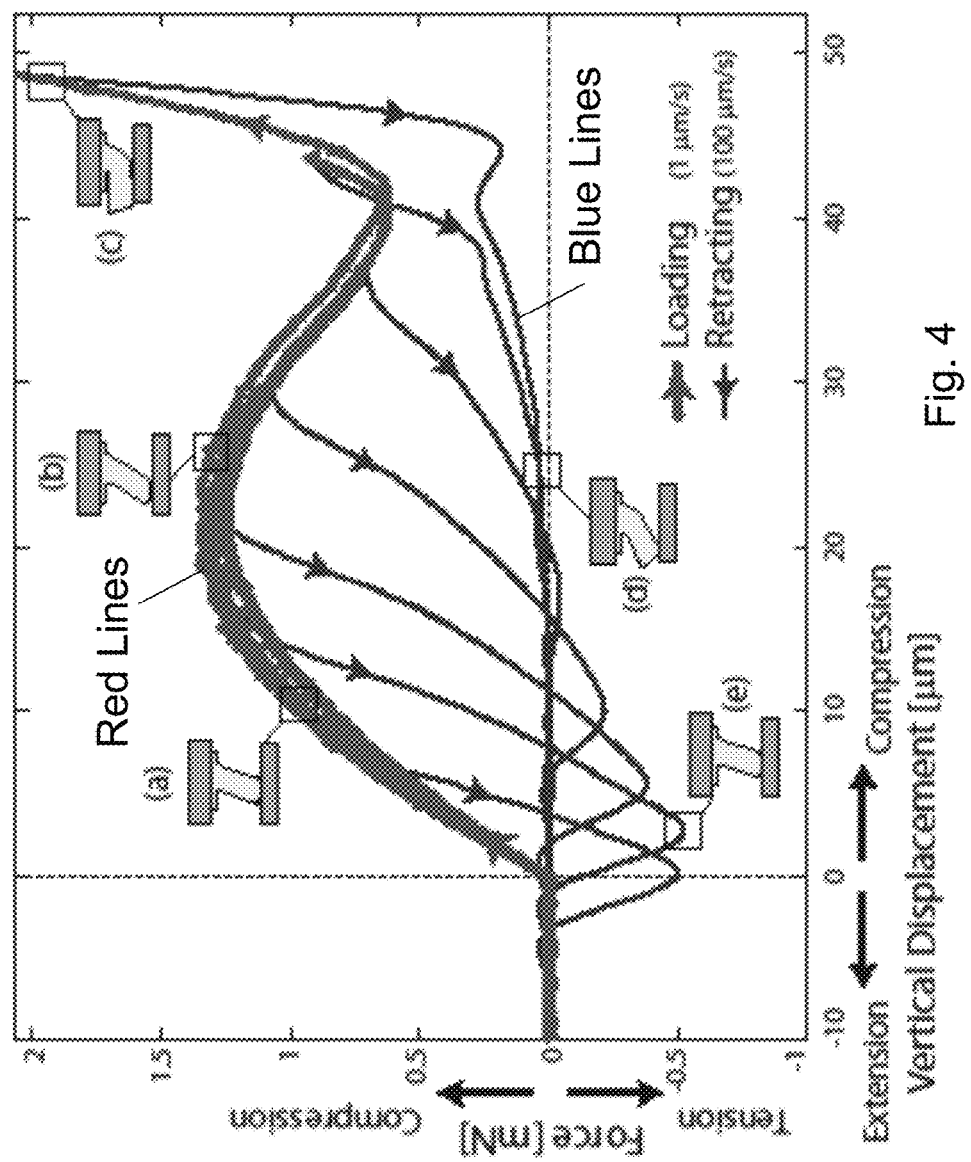
FIG. 4 shows force-distance curves for a round tip adhesive fiber fabricated according to the present invention.
Figure 5:
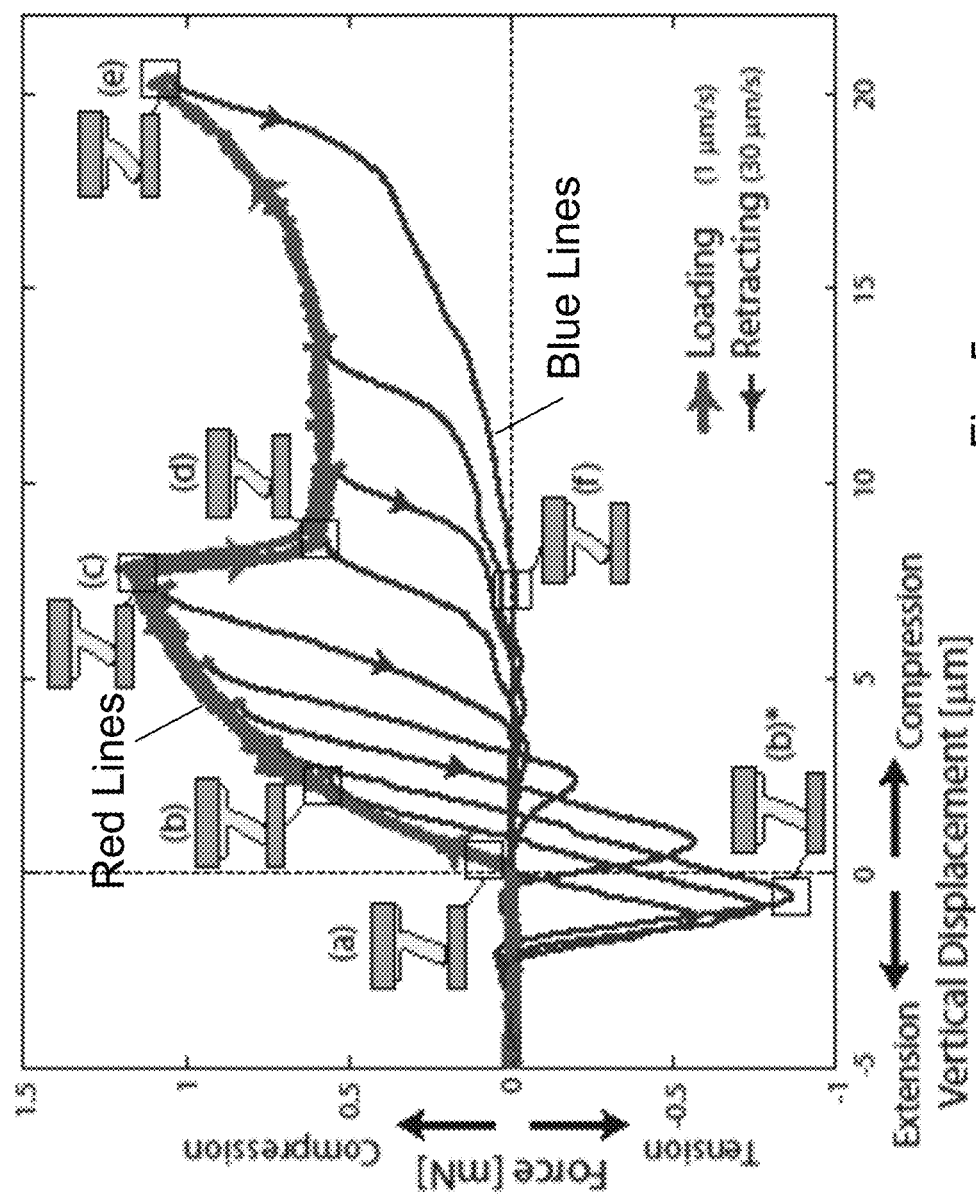
FIG. 5 shows force-distance curves for a flat tip adhesive fiber fabricated according to the present invention.

The behavior of these contact processes was captured quantitatively in force versus displacement graphs, FIG. 4 and FIG. 5 for round and flat tips, respectively. The graphs show that there is hysteresis in the loading and unloading of the micropillar which influences the pull-off force: by compressively loading the pillar, either rounded tip or flat tip; it first makes good contact resulting in high pull-off forces. Further compression causes the tip surface to either peel away in the case of the flat tip, as indicated by the sharp drop in the measured compressive force seen at point (c) of FIG. 5. The cause for this mechanical instability relates to the nonlinear stress distribution at the tip-substrate contact face.

Now turning to FIG. 4, Force-distance (FD) curves of the round tip pillar obtained from indenting it onto a glass slide. FD data of the loading, at a constant compression rate of 1 $\mu m\ s-1$, can be seen as the overlapped red lines flowing from left to right. The pillar was retracted at 100 $\mu m\ s-1$ after different distances of vertical compression were obtained, which created the separate blue lines flowing from top right to bottom left at different intervals. The schematics of the side view of the micropillar profile are based on optical microscopy observations captured via video and correlated to the empirical FD data; the schematics show the physical behavior at points of interest along the curve, highlighted by call-out boxes. Following the red FD curve from the origin (at the intersection of the dashed lines) to the point of vertical compression at (a) then retracting along the blue curve shows how to obtain a high adhesive force, i.e. maximum tensile force, at point (e). The adhesive force is significantly reduced if beginning from the origin again, compress the pillar until it is prone, as in point (c), before retracting to point (d), where it is seen that only edge contact is made at the moment of separation. In the case of the round tip pillar, the tip slowly slides until the pillar is bent and making contact on its side (point (c)). By controlling the vertical or shear displacement, the contact area of the pillar is controlled, and thereby control whether it is in the pick state, defined as when the pillar exerts the maximum pull-off force, or in the release state, defined as when the pull-off force is minimized. However, the picking retraction speed can range from about 1 nanometer/second up to about 1 meter/second.

Now turning to FIG. 5, the flat tip pillar was compressed onto a glass slide at 1 μm s−1 then retracted at 30 μm s−1 to create force-distance (FD) curves. Loading is graphed as overlapping red lines flowing from left to right, and retracting data is graphed as intermittently spaced blue lines flowing from the top-right to the bottom-left. The schematics of the micropillar profile are labeled to correspond directly with the information in FIGS. 3A-F, and the schematics are mapped by call-out boxes to the points along the FD curve where the mircopillar takes the represented shape. Compressing the pillar from the origin (the intersection of dashed lines) to gentle contact at point (a), then to point (b) before retracting to point (b)* gives a high adhesive force (i.e. maximum tensile force). Note that the shape of the pillar at (b)* is visually identical to its shape at (b), but it is in tension, so the * is used to denote the difference. Compressing the pillar past point (b) reveals a mechanical instability from point (c) to point (d) where the tip peels away suddenly, and by compressing even further, only the edge remains in contact at point (e) before retracting to point (f) where the pillar is making minimal contact at the moment of separation. However, the picking retraction speed can range from about 1 nanometer/second up to about 1 meter/second.

Figure 6:
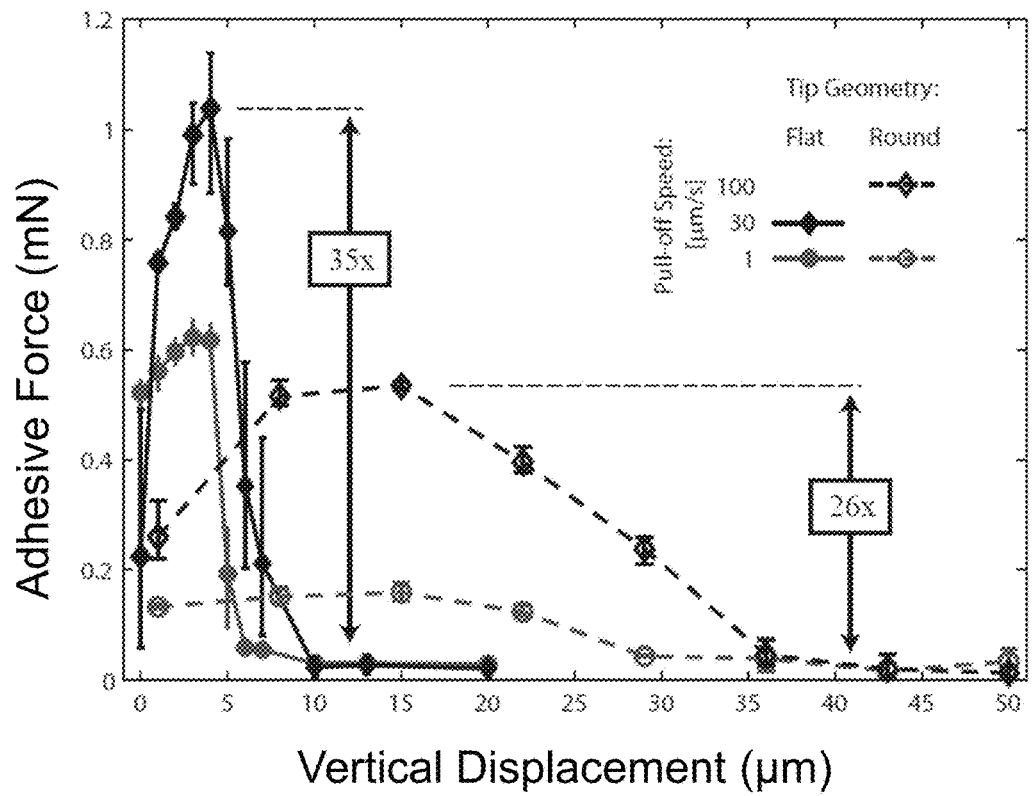
FIG. 6 shows adhesive forces of flat and round tip adhesive fibers measured during pull-off from a glass substrate.

Comparing the behavior of the flat tip pillar and round tip pillar under compression shows that the flat tip has a larger pull-off force and a sharper switch between the "pick" and "release" states, which is defined as the states where maximum and minimum pull-off forces are exerted, respectively (FIG. 6). The round tip has a less sharp distinction between pick and release states, and a lower peak pull-off force. The pick-to-release adhesive force ratio of the flat tip was found to be 35 to 1 and the round tip had an pick-to-release adhesive force ratio of 26 to 1. The adhesive forces of flat and round tip pillars measured during pull-off from a glass substrate, after a given vertical displacement in the compressive direction, are plotted for different retraction speeds. The slowest available retraction speed of the actuator, 1 μm s−1, minimized the adhesive forces for both the flat tip pillar (solid red lines connecting filled circles) and the round tip pillar (dashed red lines connecting open circles). The optimal pull-off speed for the flat tip was 30 μm s−1 (solid blue lines connecting filled diamonds) and for the round tip the optimal pull-off speed was 100 μm s−1 (dashed blue lines connecting open diamonds). Each data point represents the median and the error bars indicate the minimum and maximum force values of three experiments. These results demonstrated how the flat tip pillar has higher ratio of 35 to 1 and sharper switch between pick and release states than the round tip pillar with a ratio of 26 to 1 and a smooth switch between states. The pick-to-release adhesive force ratio of the flat tip and round tip can range from about 1 to 1 up to about 100,000 to 1.

It should be noted that the peak pull-off force of the flat tip was twice that of the round tip, but the pick-to-release adhesive force ratio of the flat tip was less than twice that of the round tip pick-to-release adhesive force ratio because the release-state of the round tip proved to exert a smaller force. It was observed that the release-state depended on the roughness produced through fabrication stochasticity along the edge of the tip. In some embodiments of the present invention, bumps or other structures can be added along the edge will reduce the release-state adhesion and enhance the pick-to-release ratio. It was observed that alignment was a factor for improving performance of the flat tip, but could be neglected for the round tip. This difference may be used in some embodiments for applications requiring easy or robust alignment. Due to the higher pull-off force and sharper distinction between pick and release states, the flat tip pillar can be a preferred embodiment described below.

Effect of Shear Displacement

A previous investigation into flat tipped angled micropillars proposed an analytical model of the stress on the tip of the pillar. That model suggests that the angle of inclination of the pillar facilitates an uneven stress distribution during loading, causing the pillar to lose tip contact. The present invention has shown how adhesive forces can maximize or minimize simply by loading the pillars compressively (FIG. 6). However, a similar control strategy can be implemented in some embodiments of the present invention by the addition of shear displacement.

Figure 7:
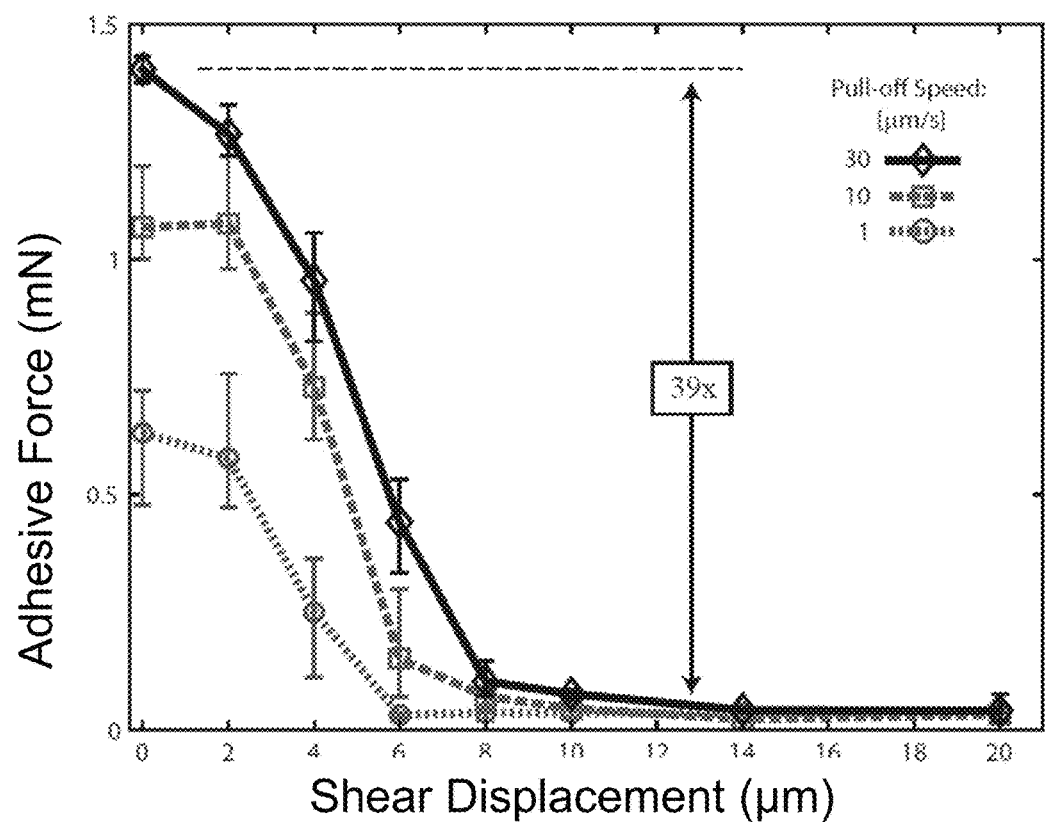
FIG. 7 shows adhesive forces of flat tip adhesive fibers measured at pull-off for different shear displacements and retraction speeds.

Now turning to FIG. 7, the adhesive forces of flat tip pillars measured at pull-off for different shear displacements and retraction speeds. Flat tip pillars where first contacted to glass with 4 μm of compression to ensure maximum tip contact, then sheared laterally before being retracted vertically at 1 μm s−1 (plotted with red circles), 10 μm s−1 (green squares), or 30 μm s−1 (blue diamonds). Each data point and error bars represent the median and minimum and maximum force values, respectively, of three tests. The pick-to-release adhesive force ratio was found to be 39 to 1, but can range from about 1 to 1 to about 100,000 to 1. In FIG. 7, it is observed that with no shearing and good tip contact, achieved through 4 μm compression, there is a maximum pull-off force. Any amount of lateral shear displacement reduces the pull-off force until the release state is achieved for shear displacements of ≥8 μm. In this case, the repeatably observed pick-to-release adhesive force ratio of 39 to 1 is comparable to, but greater than, compression only switching. From micromanipulation trials, it is found that using shear displacement control of adhesion to be repeatable and reliable. Shear displacement control was found to be more reliable than compression-only control during pick-and-place experiments.

Demonstration of Manipulation

Using the vertical or shear displacement based contact area control of the micropillars, the present invention enables pick-and-place manipulation of objects. Such adhesion control can be seen in an assembly task in FIGS. 8A-F, where the indentation of the pillar into the silicon microplatelet is critical for pick-and-place manipulation. Video snapshots from an inverted microscope show the steps of pick-and-place manipulation of the silicon microplatelets: FIG. 8A illustrates the micromanipulator contacting the first part, FIG. 8B illustrates the first part being picked up from the substrate, and FIG. 8C illustrates bringing the first part in contact with the second part. With a loading condition of 4 μm of compressive displacement, the flat tip pillar tip made good contact with the part and could lift it off of the glass slide as demonstrated in FIG. 8C. The tips of the micro- and/or nano-scale fibers can be compressed by from about 1 nm up to about 100 mm of compressive displacement when making contact with parts. After moving to the desired location above the first part, the second part was released by increasing the downward (compressive) displacement (FIG. 8D) until the flat tip pillar lost tip contact (FIG. 8E). FIG. 8E illustrates the pillar being slowly retracted. When the pillar was retracted after tip contact was lost, the adhesion was low enough to release the second part on top of first (FIG. 8F) thus completing the microassembly. Alternatively, shear displacement can be used in addition to compression of the fibers or in place of compression of the fibers. When shear displacement is used along with compression of the fiber, shear displacement can occur before or after compression of the fibers.

The same principle used to control a single angled micropillar's adhesive state can be applied to arrays of angled micropillars. A 4×1 cm² glass cover slip was picked up and placed down with a 10×10 array of round tip micropillars demonstrating the extensibility of this approach to larger length scales and heavier parts. FIGS. 9A-D are video stills from a demonstration of the macroscale manipulation capability of a 10×10 array of round tip micropillars. The cover slip has been outlined and schematics representing the deformed state of any given pillar have been included to guide the reader: FIG. 9A is the array vertically displaced to sufficiently compress it to form a large contact before retracting rapidly and picking up the glass cover slip illustrated in FIG. 9B. FIG. 9C illustrates vertical displacement control is utilized to compress the array of round tip pillars and induce edge contact when brought into contact again. FIG. 9D illustrates that retracting the array slowly will enable the cover slip to be released.

Other embodiments can include picking and releasing two or more parts. These embodiments will require only a portion of the available plurality of micro- and/or nano-scale fibers to contact to a part to be picked and released. Below is an example of the operational procedure for picking and releasing two or more parts. For illustration purposes, two parts will be picked and released, but this illustration is not meant to limit the invention to only simultaneously picking and releasing two parts:

Step 1: Providing a manipulation device with a plurality of micro- and/or nano-scale fibers, wherein each micro- and/or nano-scale fiber has a tip;

Step 2: Contacting the first part with one or more tips of the plurality of micro- and/or nano-scale fibers to form a first set of contacted tips;

Step 3: Picking up the first part and maneuvering it in position of the second part;

Step 4: Contacting the second part with one or more non-contacted (or free or available) tips of the plurality of micro- and/or nano-scale fibers to form a second set of contacted tips;

Step 5: Picking up the second part and simultaneously maneuvering the first and second parts in position of a release location;

Step 6: Compressing the first and second sets of contacted tips of the plurality of micro- and/or nano-scale fibers until the first and second sets of contacted tips lose contact with the first and the second parts and/or laterally shearing the first and second sets of contacted tips of the plurality of micro- and/or nano-scale fibers until the first and second sets of contacted tips lose contact with the first and second parts; and Step 7: Retracting the plurality of micro- and/or nano-scale fibers away from the first and second parts to release the first and second parts from the manipulation device.

In operation, the present invention can manipulate parts from meter scale down to nanometer scale, planar, curved or any 3D shaped components, biological specimens such as tissues, surgical films, organs, and cells, fragile components. The present invention can manipulate a single part one at a time or many parts in parallel at a time as described above. The manipulation method can be used in transfer printing of flexible electronics components, semiconductor industry pick-and-place applications of chips, wafers, packaging components, biological specimen applications, car or other industry part pick-and-place applications, etc. The major advantages to the present invention are: 1) no damage to the parts; 2) no residue left on the parts; 3) manipulation can be made in vacuum, air, or liquid; 4) 3D part manipulation is possible; 5) parallel manipulation is possible; 6) it is easy to clean the fiber manipulator if contaminates; 7) the present invention method is simple and compact with minimal infrastructural needs with compared to suction and magnetic methods. The present invention manipulation method can be used as basic robotic positioning and orientation based discrete manipulation method or as a roll-to-roll based continuous manufacturing method. The present invention fibers and manipulation method can be used for enabling dry self-cleaning gecko adhesive structures since these fibers can pick dirt particles and release them on clean surfaces using the picking and releasing methods demonstrated here.

Figure 12:
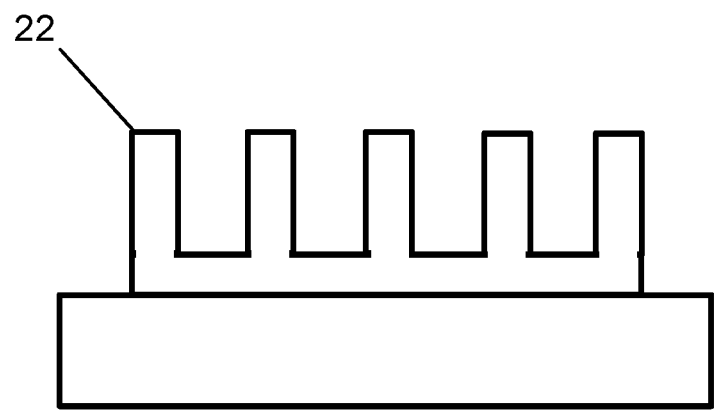

The present invention applies to fibers with any tip shape (for example, rounded, flat, symmetric or asymmetric flat mushroom, angled mushroom, etc.), any fiber angle (vertical or angled, shown in FIGS. 12 and 10, respectively), any stem cross-sectional geometry (for example, cylindrical, triangular, pyramid, square, gradually getting smaller or larger, symmetric/asymmetric, tubular micro/nano-structures such as nanotubes, nanowires, etc.), and any fiber/tip material (for example, elastomers. polymers, any (carbon, polymer or metallic), nanotube materials, any nanowire materials, etc.). The core common property of the manipulation of the present invention is independent from the fiber/tip geometry/material such that:

Pick: Have a good (fiber) tip contact area with the part to create good adhesion to pick it up from the first substrate. Additionally, the present invention also used increased retraction speed during picking to increase adhesion with the part.

Release: Reduce the tip contact area by loading the fiber vertically and/or laterally to release the part easily on the second substrate.

Above methods apply to both a single fiber or a fiber array.

The patent application illustrates only cylindrical angled fibers with rounded and flat tips to pick and place parts as the experimental demonstrations while the manipulation method applies to all cases discussed above.

Figure 11:
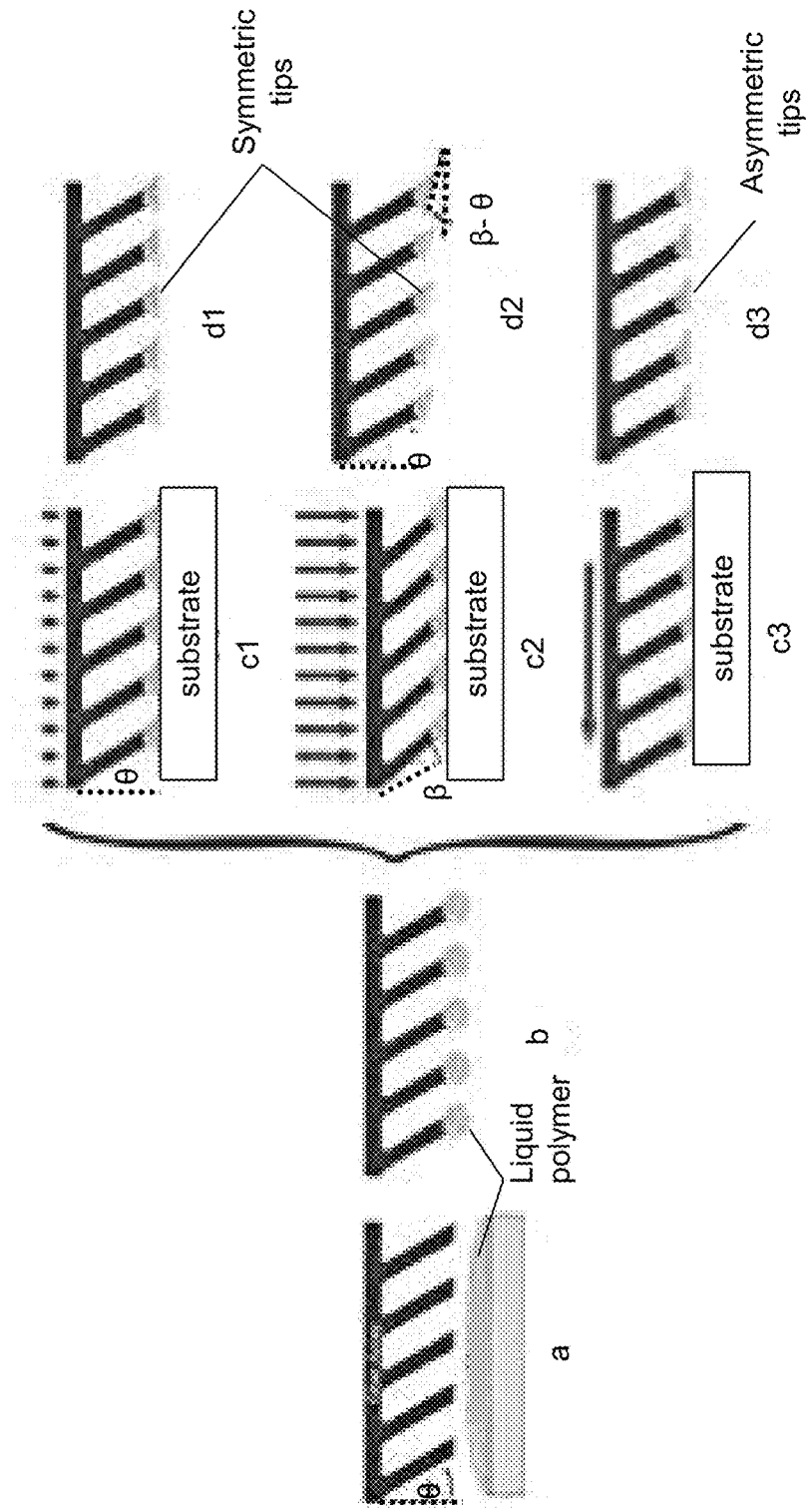
FIG. 11 illustrates examples of fiber tip forming operations.

FIG. 11 illustrates examples of fiber tip forming operations:

Step a: Dip an array of angled fiber tips into a liquid polymer, wherein each angled fiber has a pre-set angle θ relative to a backing layer;

Step b: Remove the angled fiber tips from the liquid polymer;

Step c1: Apply a downward force onto the backing layer of the array to contact the fiber tips with liquid polymer onto a substrate without causing the array of angled fibers to bend or deflect beyond the pre-set angle θ;

Step d1: Remove the array of angled fiber tips from substrate after the liquid polymer cures to form symmetrical flat tips that are parallel with the backing layer; or Step c2: Apply a downward force onto the backing layer of the array to contact the angled fiber tips with liquid polymer onto a substrate causing the angled fibers to bend or deflect by an angle β beyond its pre-set angle θ;

Step d2: Remove the fiber tips from substrate after the liquid polymer cures to form symmetrical flat tips that are not parallel with the backing layer at an angle β-θ.

To form asymmetric fiber tips, follow any of the preceding steps (a, b, c1 or a, b, c2), and then apply a lateral force onto the backing layer of the array and cure the liquid polymer to form asymmetric fiber tips (Step c3) and remove the fiber tips from the substrate after the liquid polymer cures to form asymmetrical flat tips that are parallel with the backing layer (Step d3). Though Step c3 in FIG. 11 is an embodiment associated with Steps a, b, and c1, another embodiment can also be associated with Steps a, c, and c2 as well as form asymmetrical flat tips that are not parallel with the backing layer at an angle β-θ.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

We claim:

1. A method of using micro- and/or nano-scale fibers to manipulate a first part, comprising the steps of:
    providing a manipulation device with a plurality of micro- and/or nano-scale fibers,
        wherein each micro- and/or nano-scale fiber has a tip with a flat surface that is parallel to a backing layer,
        wherein each micro- and/or nano-scale fiber is perpendicular to the backing layer;
    contacting the first part with the flat surface of one or more tips of the plurality of micro- and/or nano-scale fibers to form contacted tips;
    picking up the first part and maneuvering it from a first position to a second position;
    reducing a contact area of each contacted tip of the contacted tips with the first part by displacing the plurality of micro- and/or nano-scale fibers towards the first part to cause the fiber to deform and the contacted tips to peel away from the first part; and
    retracting the plurality of micro- and/or nano-scale fibers away from the first part to release the first part from the manipulation device.

2. The method of claim 1, wherein the micro- and/or nano-scale fibers have a pick-to-release adhesive force ratio of about 1 to 1 up to about 100,000 to 1.

3. The method according to claim 1, wherein the step of contacting the first part with the flat surface of one or more tips of the plurality of micro- and/or nano-scale fibers further comprises compressing the micro- and/or nano-scale fibers by about 1 nm up to about 100 mm of compressive displacement.

4. The method according to claim 1, wherein reducing a contact area of each contacted tip of the contacted tips with the first part further comprises:
laterally shearing the contacted tips of the micro- and/or nano-scale fibers.

5. The method according to claim 1, wherein the step of contacting the first part with the flat surface of one or more tips of the plurality of micro- and/or nano-scale fibers to form contacted tips and the step of displacing the plurality of micro- and/or nano-scale fibers further comprise the step of emitting monochromatic green light with a corresponding optical filter to visualize tip contact geometry and contact area of the tips of the plurality of micro- and/or nano-scale fibers.

6. The method according to claim 1, further comprising the step of contacting a second part with the flat surface of one or more non-contacted tips of the micro- and/or nano-scale fibers.

7. The method according to claim 6, further comprising simultaneously maneuvering the first and second parts in position of a release location.

8. The method according to claim 1, wherein the step of picking up the first part further comprises the step of retracting the plurality of micro- and/or nano-scale fibers at a retraction speed about 1 nanometer/second up to about 1 meter/second.

9. The method according to claim 1, wherein displacing the plurality of micro- and/or nano-scale fibers comprises vertically displacing the plurality of micro- and/or nano-scale fibers.

10. The method according to claim 1, wherein displacing the plurality of micro- and/or nano-scale fibers comprises laterally displacing the plurality of micro- and/or nano-scale fibers.

11. The method according to claim 1, wherein displacing the plurality of micro- and/or nano-scale fibers comprises vertically and laterally displacing the plurality of micro- and/or nano-scale fibers.

12. A method of using micro- and/or nano-scale fibers to manipulate a first part, comprising the steps of:
    providing a manipulation device with a plurality of micro- and/or nano-scale fibers,
        wherein each micro- and/or nano-scale fiber has a tip with a flat surface that is parallel to a backing layer,
        wherein each micro- and/or nano-scale fiber is perpendicular to the backing layer;
    contacting the first part with the flat surface of one or more tips of the plurality of micro- and/or nano-scale fibers to form contacted tips, wherein a pull-off force is increased;
    picking up the first part and maneuvering it from a first position to a second position;
    displacing the plurality of micro- and/or nano-scale fibers towards the first part to cause the fibers to deform and the contacted tips to peel away from the first part, thereby forcing the contacted tips into a release state, whereby the pull-off force is reduced; and
    retracting the plurality of micro- and/or nano-scale fibers away from the first part to release the first part from the manipulation device.

13. The method according to claim 12 wherein the micro- and/or nano-scale fibers have a maximum pick-to-release adhesive force ratio of from about 1 to 1 up to about 100,000 to 1.

14. The method according to claim 12, wherein the step of contacting the first part with the flat surface of one or more tips of the plurality of micro- and/or nano-scale fibers further comprises compressing the micro- and/or nano-scale fibers by about 1 nm up to about 100 mm of compressive displacement.

15. The method according to claim 12, wherein the step of contacting the first part with the flat surface of one or more tips of the plurality of micro- and/or nano-scale fibers to form contacted tips and the step of forcing the contacted tips into a release state further comprise the step of emitting monochromatic green light to visualize tip contact geometry and contact area of the tips of the plurality of micro- and/or nano-scale fibers.

16. The method according to claim 12, further comprising the step of contacting a second part with the flat surface of one or more non-contacted tips of the micro- and/or nano-scale fibers.

17. The method according to claim 16, further comprising simultaneously maneuvering the first and second parts in position of a release location.

18. The method according to claim 12, wherein the step of picking up the first part further comprises the step of retracting the plurality of micro- and/or nano-scale fibers at a retraction speed about 1 nanometer/second up to about 1 meter/second.

19. The method according to claim 12, wherein forcing the contacted tips into a release state comprises peeling the contacted tips from the first part.

20. A method of using micro- and/or nano-scale fibers to manipulate a first part relative to a second part, comprising the steps of:
providing a manipulation device with a plurality of micro- and/or nano-scale fibers,
wherein each micro- and/or nano-scale fiber has a tip with a flat surface that is parallel to a backing layer,
wherein each micro- and/or nano-scale fiber is perpendicular to the backing layer;
contacting the first part with the flat surface of one or more tips of the plurality of micro- and/or nano-scale fibers to form a first set of contacted tips;
picking up the first part and maneuvering it in position of the second part;
contacting the second part with the flat surface of one or more non-contacted tips of the plurality of micro- and/or nano-scale fibers to form a second set of contacted tips;
picking up the second part and simultaneously maneuvering the first and second parts in position of a release location;
reducing a contact area of the first and second sets of the contacted tips by displacing the plurality of micro- and/or nano-scale fibers towards the first or second parts to cause the fibers to deform and the first and second sets of contacted tips to peel away from the first part and second part; and
retracting the plurality of micro- and/or nano-scale fibers away from the first and second parts to release the first and second parts from the manipulation device.

21. The method according to claim 20, wherein the step of picking up the first part and maneuvering it in position of the second part further comprises the step of retracting the plurality of micro- and/or nano-scale fibers at a retraction speed about 1 nanometer/second up to about 1 meter/second.

22. A method of using micro- and/or nano-scale fibers to manipulate a first part relative to a second part, comprising the steps of:
providing a manipulation device with a plurality of micro- and/or nano-scale fibers,
wherein each micro- and/or nano-scale fiber has a tip with a flat surface that is parallel to a backing layer,
wherein each micro- and/or nano-scale fiber is perpendicular to the backing layer;
contacting the first part with the flat surface of one or more tips of the plurality of micro- and/or nano-scale fibers to form a first set of contacted tips, wherein a pull-off force of the first set of contacted tips is increased;
picking up the first part and maneuvering it in position of the second part;
contacting the second part with the flat surface of one or more non-contacted tips of the plurality of micro- and/or nano-scale fibers to form a second set of contacted tips, wherein a pull-off force of the second set of contacted tips is increased;
picking up the second part and simultaneously maneuvering the first and second parts in position of a release location;
displacing the plurality of micro- and/or nano-scale fibers towards the first part or the second part to cause the fibers to deform and the contacted tips to peel away from the first part, thereby forcing the contacted tips into a release state, whereby the pull-off force of the first set of contacted tips and the pull-off force of the second set of contacted tips are reduced; and
retracting the plurality of micro- and/or nano-scale fibers away from the first and the second parts to release the first and second parts from the manipulation device.

23. The method according to claim 22, wherein the step of picking up the first part and maneuvering it in position of the second part further comprises the step of retracting the plurality of micro- and/or nano-scale fibers at a retraction speed about 1 nanometer/second up to about 1 meter/second.

* * * * *